United States Patent
Nagaoki et al.

(10) Patent No.: US 8,586,922 B2
(45) Date of Patent: Nov. 19, 2013

(54) TRANSMISSION ELECTRON MICROSCOPE AND SAMPLE OBSERVATION METHOD

(75) Inventors: Isao Nagaoki, Hitachinaka (JP); Toshiaki Tanigaki, Hitachinaka (JP); Yoshihiro Ohtsu, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/505,119

(22) PCT Filed: Dec. 6, 2010

(86) PCT No.: PCT/JP2010/071810
§ 371 (c)(1),
(2), (4) Date: May 15, 2012

(87) PCT Pub. No.: WO2011/071008
PCT Pub. Date: Jun. 16, 2011

(65) Prior Publication Data
US 2012/0235035 A1    Sep. 20, 2012

(30) Foreign Application Priority Data

Dec. 7, 2009 (JP) ................................ 2009-277305

(51) Int. Cl.
*H01J 37/26* (2006.01)
(52) U.S. Cl.
USPC ........................................................ 250/311
(58) Field of Classification Search
CPC ....................................................... H01J 37/265
USPC ........................................................ 250/311
See application file for complete search history.

(56) References Cited

U.S. PATENT DOCUMENTS

| 4,608,491 A | 8/1986 | Kokubo |
| 5,866,905 A * | 2/1999 | Kakibayashi et al. ........ 250/311 |

(Continued)

FOREIGN PATENT DOCUMENTS

| JP | 60-105149 A | 6/1985 |
| JP | 9-167591 A | 6/1997 |

(Continued)

OTHER PUBLICATIONS

English translation of International Preliminary Report on Patentability and Written Opinion of the International Searching Authority.

(Continued)

*Primary Examiner* — Jack Berman
*Assistant Examiner* — Eliza Osenbaugh-Stewart
(74) *Attorney, Agent, or Firm* — Crowell & Moring LLP (57) ABSTRACT

A transmission electron microscope includes an electron gun 1 that irradiates a sample 5 with an electron beam 2; an electron detector 13 that detects electrons that are passed through the sample 5 and scattered; a first detection-side annular aperture 15 that is located between the electron detector 13 and the sample 5 and has a ring-shaped slit that limits inner and outer diameters of a transmission region of electrons scattered from the sample 5; and a second detection-side annular aperture 16 that is located between the first detection-side annular aperture 15 and the electron detector 13 and has a ring-shaped slit that limits inner and outer diameters of a transmission region of scattered electrons that have passed through the first detection-side annular aperture 15. It is, therefore, possible to detect electrons scattered at high scattering angles without a limitation caused by a spherical aberration of an electron lens and improve a depth resolution.

8 Claims, 10 Drawing Sheets

(56) References Cited

U.S. PATENT DOCUMENTS

| | | | |
|---|---|---|---|
| 6,051,834 A | 4/2000 | Kakibayashi et al. | |
| 2007/0158568 A1 | 7/2007 | Nakamura et al. | |
| 2007/0284536 A1* | 12/2007 | Frosien ................ | 250/396 R |
| 2008/0197282 A1 | 8/2008 | Nakayama et al. | |

FOREIGN PATENT DOCUMENTS

| | | |
|---|---|---|
| JP | 2000-21346 A | 1/2000 |
| JP | 2000-294184 A | 10/2000 |
| JP | 2007-179753 A | 7/2007 |
| JP | 2008-66057 A | 3/2008 |
| JP | 2008-204642 A | 9/2008 |
| JP | 2008-270056 A | 11/2008 |

OTHER PUBLICATIONS

Corresponding International Search Report with English Translation dated Mar. 1, 2011 (five (5) pages).

Form PCT/ISA/237 (four (4) pages).

Michiyoshi Tanaka, "Hollow Corn Beam Method in Convergent-Beam Electron Diffraction", Solid State Physics, 1986, vol. 21, No. 3, pp. 155-160.

Koh Saitoh, "Defection of Interstitial Atoms by Hollow-Cone-Beam High-Angle Annular Dark-Field Scanning Transmission Electron Microscopy", Reports of Toyoda Physical and Chemical Research Institute, 2007, vol. 60, pp. 137-141.

Yukihito Kondo et al., "New Electron Diffraction Techniques Using Electronic Hollow-Cone Illumination", Japanese Journal of Applied Physics, Mar. 1984, vol. 23, No. 3, pp. L178-L180.

* cited by examiner

TRANSMISSION ELECTRON MICROSCOPE AND SAMPLE OBSERVATION METHOD

TECHNICAL FIELD

The present invention relates to a transmission electron microscope and a sample observation method.

BACKGROUND ART

There is a transmission electron microscope that has an annular aperture, a lens and a pinhole, which are located between a sample and an electron detector, and causes the annular aperture to remove unnecessary electrons scattered from the sample, causes the lens to focus necessary scattered electrons that have passed through the annular aperture on the pinhole and detects the necessary scattered electrons (refer to Patent Document 1).

PRIOR ART LITERATURE

Patent Document

Patent Document 1: JP-2008-270056-A

SUMMARY OF THE INVENTION

Problem to be Solved by the Invention

In general, a focusing lens that focuses an electron beam has a spherical aberration. For the technique described in Patent Document 1, in order to focus the scattered electrons that have passed through the annular aperture on the pinhole, an expensive spherical aberration corrector needs to be arranged. A microscope of this type is capable of measuring compositional contrast as a high angle annular dark field (HAADF) image by detecting electrons scattered at a scattering angle of 80 mrad or higher and has an advantage of improving a depth resolution by detecting the electrons scattered at the high angle. However, Scattering angles of electrons that can be corrected by the spherical aberration corrector are limited.

An object of the present invention is to provide a transmission electron microscope and a sample observation method, which enable electrons scattered at high angles to be detected without a limitation caused by a spherical aberration of an electron lens and enable a depth resolution to be improved.

Means for Solving the Problem

The present invention relates to a technique for causing a plurality of annular apertures to limit electrons scattered by irradiating a sample with an electron beam and detecting scattered electrons that have passed through the plurality of annular apertures.

In addition, the present invention relates to a technique for causing a single annular aperture to limit electrons scattered by irradiating a sample with an electron beam and causing an electron detector with a light receiving surface to detect scattered electrons that have passed through the single annular aperture.

Effects of the Invention

According to the present invention, it is possible to detect electrons scattered at high angles without a limitation caused by a spherical aberration of an electron lens and improve a depth resolution.

MODE FOR CARRYING OUT THE INVENTION

Embodiments of the present invention are described below with reference to the accompanying drawings.

First, a comparative example is described below.

In recent years, an application of a technique for an optical confocal microscope to an electron microscope has started to be considered. However, many interactions of an electron beam with a sample occur, and a spherical aberration largely affects the electron microscope. Thus, it is difficult to simply use the technique (for the optical microscope) for the electron microscope.

Figure 1:
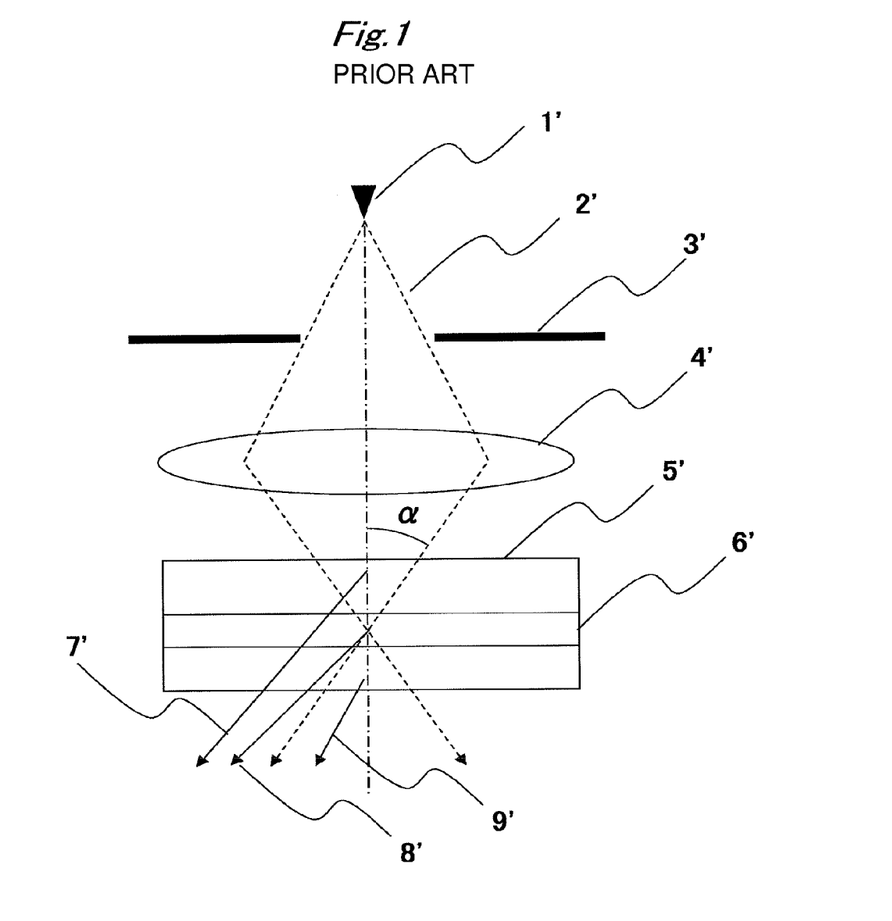
FIG. 1 is a schematic diagram illustrating an electron irradiation system included in an electron microscope according to a comparative example.

As illustrated as the comparative example in FIG. 1, a configuration is known in which an electron beam 2' that is emitted by an electron gun 1' passes through a circular hole of a condenser aperture 3' and is thereby selected so that a focusing lens 4' focuses the desired electron beam 2' and a sample 5' is irradiated with the electron beam 2'.

In the comparative example, the electron beam 2', with which the sample 5' is irradiated and which has passed through a part (located near the center of the focusing lens 4') of the focusing lens 4', passes through the sample 5'. Thus, when the sample 5' is a crystalline sample, a strong channeling effect occurs depending on a crystal orientation. In this case, when a target region 6' to be observed is located in the sample 5' or a specific region included in the sample 5' and located in a thickness direction (optical axis direction), an electron 7' is scattered from the side of the electron gun 1' or an electron 9' is scattered from a layer located on the opposite side of the electron gun 1', and the scattered electron 7' and the scattered electron 8' become noise so that a desired depth resolution cannot be ensured. Thus, it is desirable to suppress the occurrence of the scattered electrons 7' and 8' and efficiently obtain the target electron 8' scattered from the target region 6'.

In the comparative example illustrated in FIG. 1, unless an expensive spherical aberration corrector is arranged between the focusing lens 4' and the sample 5' and corrects a spherical aberration of the focusing lens 4', a focal point of the electron beam 2' spreads in the optical axis direction. As the focal point of the electron beam 2' spreads, the depth resolution is deteriorated. Since an electron beam (electron beam that is an outer circumferential part of the electron beam 2' and incident on a focal point region at a relatively large irradiation angle α) with which a cone-shaped region that is located in the sample 5' is irradiated largely contributes to the depth resolution, the electron beam that has passed through the part (located near the center of the focusing lens 4') of the focusing lens 4' is an unnecessary electron beam and may unnecessarily damage the sample 5'.

Figure 2:
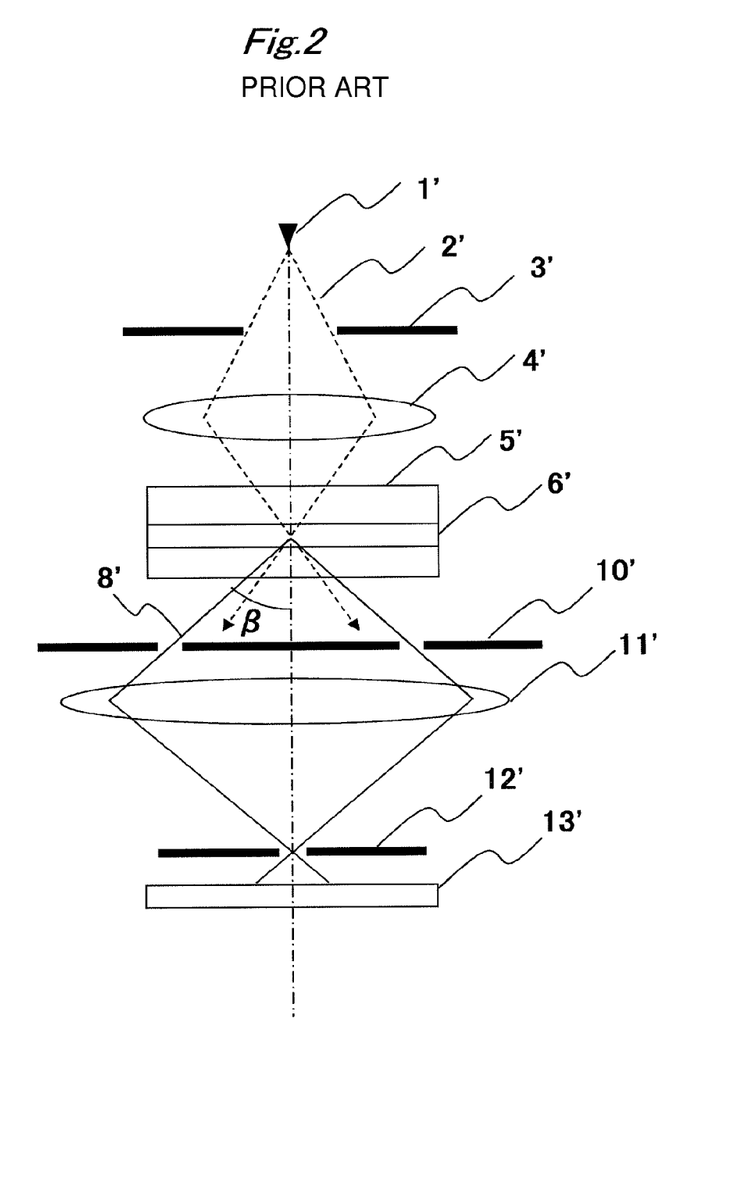
FIG. 2 is a schematic diagram illustrating a scattered electron detection system and the electron irradiation system, which are included in the electron microscope according to the comparative example.

When a technique for an optical confocal microscope is used for a scattered electron detection system according to the comparative example, a configuration in which a pinhole 12' is arranged in front of an electron detector 13' can be considered as illustrated in FIG. 2. In the configuration illustrated in FIG. 2, a lens 11' that is arranged between the sample 5' and the electron detector 13' focuses the target electrons 8' scattered at an angle β on the pinhole 12'.

In this case, an annular aperture 10' is arranged between the sample 5' and the lens 11'. If the annular aperture 10' is not arranged, electrons that are scattered from a region other than the target region 6' pass through the pinhole 13' and reach the electron detector 13' due to a spherical aberration of the lens 11', and the pinhole 12' does not effectively function. When the annular aperture 10 is arranged and a spherical aberration corrector (not illustrated) is arranged between the lens 11 and the pinhole 12, it is necessary to suppress incidence of the electrons scattered from the region other than the target region 6' on the electron detector 13'.

There are, however, problems that the spherical aberration corrector that corrects the spherical aberration of the lens 11 is an expensive part and scattering angles of the electrons that can be corrected are limited. The confocal microscope is capable of measuring compositional contrast as a high angle annular dark field (HAADF) image by detecting electrons scattered at angles of 80 mrad or higher and has an improved depth resolution. Thus, there is a demand for a scattered electron detection system that is capable of detecting electrons scattered at high angles without being affected by a spherical aberration of an electron lens.

First Embodiment

Figure 3:
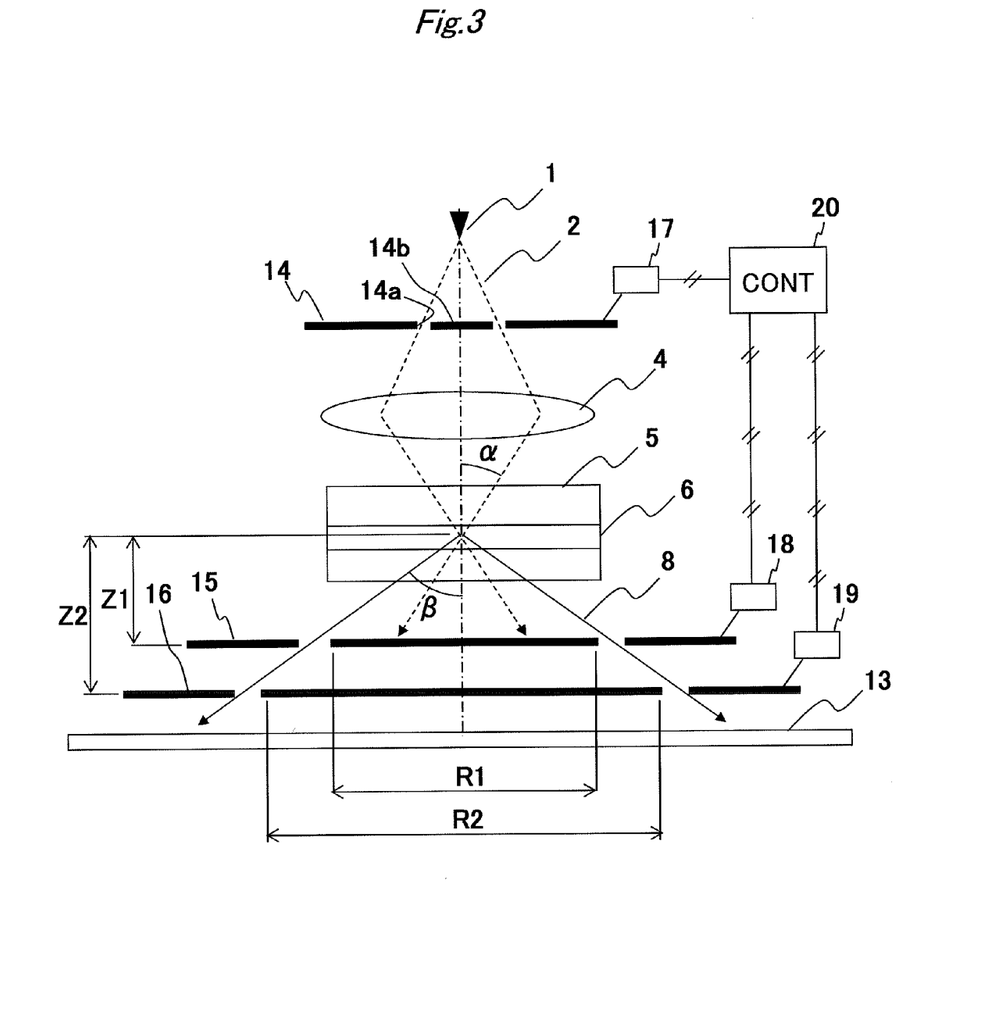
FIG. 3 is a schematic diagram illustrating a transmission electron microscope according to a first embodiment of the present invention.

FIG. 3 is a schematic diagram illustrating a transmission electron microscope according to a first embodiment of the present invention.

The transmission electron microscope illustrated in FIG. 3 includes an electron gun 1, an irradiation-side annular aperture 14, a focusing lens 4, an electron detector 13, a first detection-side annular aperture 15, a second detection-side annular aperture 16, micromotion mechanisms 17 to 19 and a control device 20. The electron gun 1 irradiates a sample 5 with an electron beam 2. The irradiation-side annular aperture 14 is located between the electron gun 1 and the sample 5. The focusing lens 4 is located between the irradiation-side annular aperture 14 and the sample 4. The electron detector 13 detects an electron that has passed through the sample 5 while being scattered. The first detection-side annular aperture 15 is located between the electron detector 13 and the sample 5. The second detection-side annular aperture 16 is located between the first detection-side annular aperture 15 and the electron detector 13. The micromotion mechanisms 17 to 19 move the annular apertures 14 to 16, respectively. The control device 20 controls the electron gun 1, the focusing lens 4 and the micromotion mechanisms.

The irradiation-side annular aperture 14 has a ring-shaped slit formed between a circular hole portion 14a and a concentric circular shielding plate 14b located on the inner side of the hole portion 14a. The shielding plate 14b is held by a plurality of thin holding portions (not illustrated) on the inner side of the hole portion 14. The hole portion 14a and the shielding plate 14b are arranged so that an optical axis of the electron beam 2 extends substantially through the center of the hole portion 14a and the center of the shielding plate 14b. An inner diameter of the hole portion 14a is smaller than the diameter of the electron beam at the position of the irradiation-side annular aperture 14. A part of the electron beam 2 emitted by the electron gun 1 propagates near the optical axis and is shielded by the shielding plate 14b. The inner and outer diameters of the electron beam 2 are limited by the hole portion 14a and the shielding plate 14b so that the electron beam 2 is formed in a hollow shape. The electron beam 2 that passes through the irradiation-side annular aperture 14 is focused on a target region 6 of the sample 5 by the focusing lens 4 so that the electron beam 2 formed in a hollow cone shape is incident on the target region 6 at an irradiation angle α(0°<α<90°) and the target region 6 is irradiated with the electron beam 2. For example, when a plurality of focusing lenses 4 are arranged by combining a dual stage lens system with an objective lens as generally applied to a TEM, the focusing of the electron beam 2 is improved. In addition, the irradiation angle α of the electron beam 2 can be changed by moving up and down the irradiation-side annular aperture 14.

The first detection-side annular aperture 15 has a ring-shaped slit in a similar manner to the irradiation-side annular aperture 14 and limits inner and outer diameters of a transmission region of electrons scattered from the sample 5. The diameter of the slit of the first detection-side annular aperture 15 and the position of the first detection-side annular aperture 15 in the optical axis direction are adjusted so that the slit of the first detection-side annular aperture 15 matches a path of target electrons 8 scattered from the target region 6.

The second detection-side annular aperture 16 has a ring-shaped slit in a similar manner to the annular apertures 14 and 15 and limits inner and outer diameters of a transmission region of scattered electrons that have passed through the first detection-side annular aperture 15. The diameter of the slit of the second detection-side annular aperture 16 and the position of the second detection-side annular aperture 16 in the optical axis direction are adjusted so that the slit of the second detection-side annular aperture 16 matches a path of the target electrons scattered from the target region 6. Thus, the diameter of the slit of the second detection-side annular aperture 16 is larger than the slit of the first detection-side annular aperture 15.

The micromotion mechanisms 17 to 19 are driving systems that each use at least one of a motor and a piezoelectric element. The micromotion mechanisms 17 to 19 move the annular apertures 14 to 16 in the optical axis direction (Z direction) and planar directions (X and Y directions) that are perpendicular to the optical axis direction. The sample 5 can be moved in the planar directions and the optical axis direction by a sample stage (not illustrated) that uses at least one of a motor and a piezoelectric element. In order to acquire an image to be observed, the sample 5 is moved (scanned) relative to the focal point region of the electron beam 2 in the planar directions and the optical axis direction. Then, the image to be observed is acquired, while information of the position of the sample stage is linked with information of detected scattered electrons. The linking is controlled by the control device 20.

In order to actually acquire the image to be observed, it is preferable to match a target point of an irradiation system for the electron beam or the position of the focal point with a target point of a detection system for scattered electrons on an atomic size level. Thus, it is necessary to adjust in detail a current to be applied to the focusing lens 4 and the positions of the annular apertures 14 to 16. A resolution of the transmission electron microscope according to the present embodiment is determined on the basis of an initial setting of the current to be applied to the focusing lens 4 and initial settings of the positions of the annular apertures 14 to 16.

In the present embodiment, a standard sample that is used to appropriately set those conditions is prepared. Examples of the configuration of the standard sample are illustrated in FIG. 4.

Figure 4A:
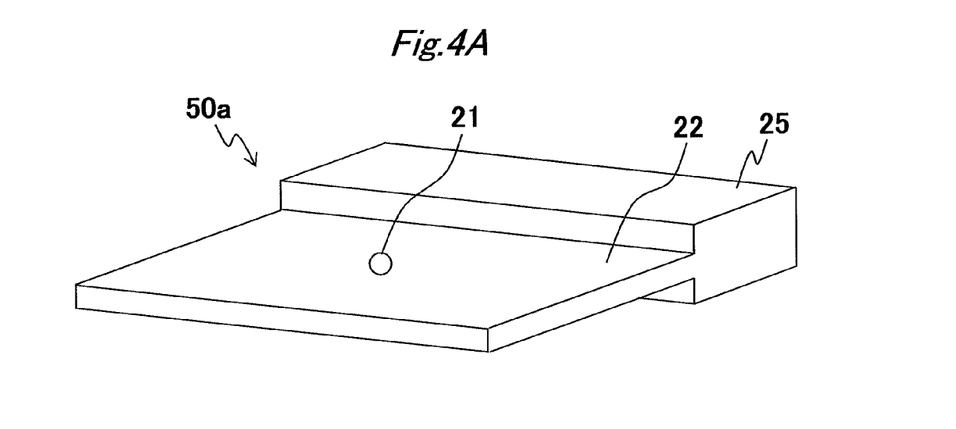
FIG. 4A is a diagram illustrating an example of the configuration of a standard sample that is used for the transmission electron microscope according to the present invention.

A standard sample 50a illustrated in FIG. 4A is an ideal configuration example. The standard sample 50a has a thin film-like holding portion 22, a target 21 and a scattered wave generating portion 25. The target 21 is held by the holding portion 22. The scattered wave generating portion 25 is located at an end of the holding portion 22. The holding portion 22 is made up of atoms that are lighter than an atom of the target 21. The target 21 is fixed onto the holding portion 22. It is preferable that the target 21 be made up of a single atom. When it is difficult to prepare the single atom, the target 21 may be replaced with a cluster that is a group of several atoms. It is sufficient if the atom of the target 21 is heavier than each of the constituent atoms of the holding portion 22. In the present embodiment, the target 21 is made up of a heavy atom (Pt, U or the like) and the holding portion 22 is made up of light atoms (C or the like), for example. The scattered wave generating portion 25 has a larger thickness than the holding portion 22. Constituent atoms of the scattered wave generating portion 25 may be the same as the holding portion 22.

Figure 4B:
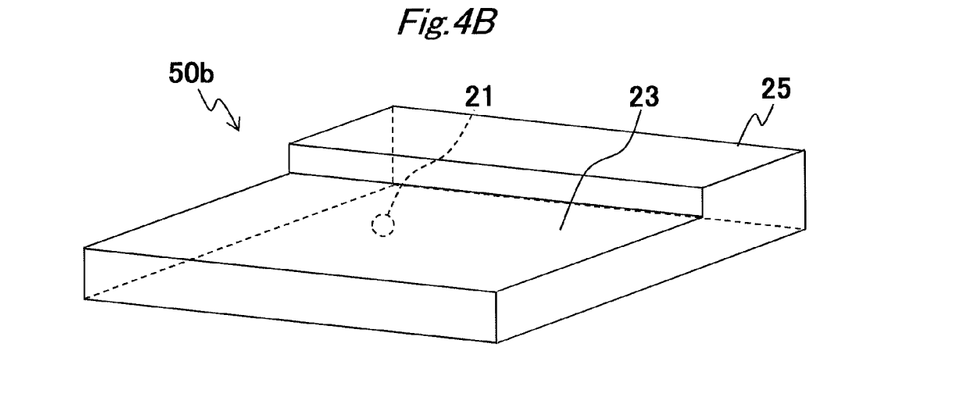
FIG. 4B is a diagram illustrating another example of the configuration of the standard sample that is used for the transmission electron microscope according to the present invention.

A standard sample 50b illustrated in FIG. 4B has a holding portion 23 and the target 21 that held in the holding portion 23. The holding portion 23 of the standard sample 50b has a thickness that enables the electron beam to easily pass through the standard sample 50b. Other features of the standard sample 50b are the same as the standard sample 50a.

Figure 4C:
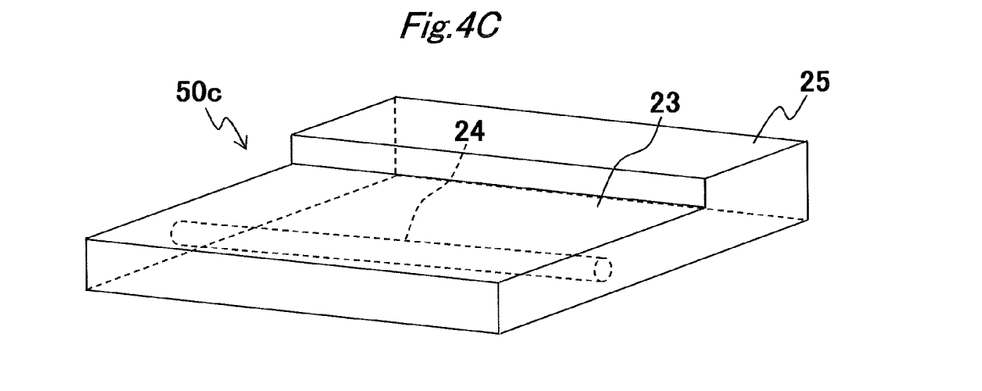
FIG. 4C is a diagram illustrating still another example of the configuration of the standard sample that is used for the transmission electron microscope according to the present invention.

A standard sample 50c illustrated in FIG. 4C is an example in which an atomic wire that has a diameter of the atomic wire is used as a target 24. The target 24 is formed in a threading dislocation formed in the holding portion 23. A technique for forming the atomic wire in the threading dislocation is generally known. When a single atom and a cluster cannot be prepared, the target 24 that is the atomic wire can be used as described in this example.

Next, the initial adjustments of the positions of the annular apertures 14 to 16 and the initial adjustment of the current to be applied to the focusing lens 4 are described. FIGS. 5 to 8 are schematic diagrams illustrating a sequence of the initial adjustments of the positions of the annular apertures 14 to 16 and the initial adjustment of the current to be applied to the focusing lens 4.

The adjustment of the position of the irradiation-side annular aperture 14 is described with reference to FIG. 5.

Figure 5A:
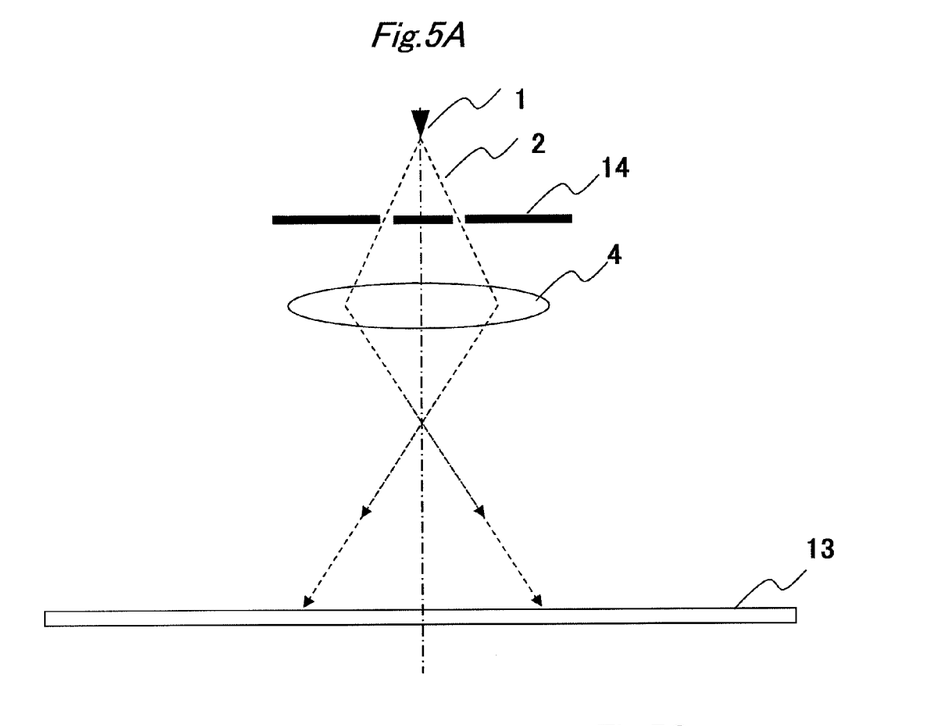
FIG. 5A is a schematic diagram illustrating a state when the position of an irradiation-side annular aperture included in the transmission electron microscope according to the first embodiment of the present invention is adjusted.
Figure 5B:
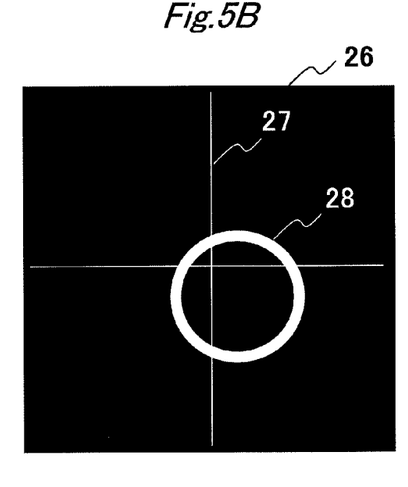
FIG. 5B is a diagram illustrating an adjustment of the position of the irradiation-side annular aperture included in the transmission electron microscope according to the first embodiment of the present invention.
Figure 5C:
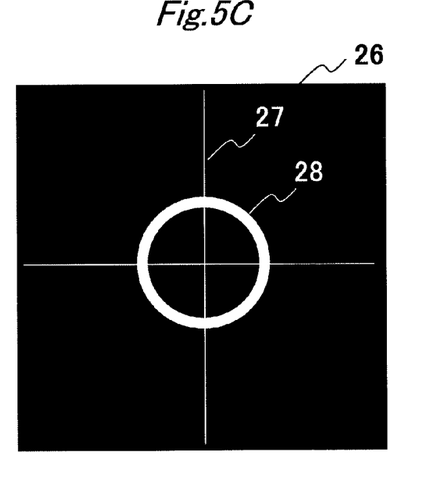
FIG. 5C is another diagram illustrating the adjustment of the position of the irradiation-side annular aperture included in the transmission electron microscope according to the first embodiment of the present invention.

In order to adjust the position of the irradiation-side annular aperture 14, the electron beam 2 that is emitted by the electron gun 1 is focused by the focusing lens 4 so that a crossover (focal point) is formed, while the sample and the detection-side annular apertures 15 and 16 are not arranged as illustrated in FIG. 5A. After that, the electron detector 13 that is located under the focusing lens 4 detects electrons. The detected electrons can be confirmed as a two-dimensional detected electron image 26 (refer to FIGS. 5B and 5C) by using an external monitor (not illustrated). A ring-shaped part that is included in the detected electron image 26 is an image of the annular slit of the irradiation-side annular aperture 14 (it can be considered that the electron detector 13 is replaced with a fluorescent plate as a simple method). In this case, guide lines 27 that are formed in a cross shape are displayed on the detected electron image 26. The irradiation-side annular aperture 14 is adjusted in advance so that a central axis of the focusing lens 4 overlaps the original point of the guide lines 27. FIG. 5B illustrates a state in which an image 28 of the slit of the irradiation-side annular aperture 14 is shifted from the central axis of the focusing lens 4. In the aforementioned procedures, the micromotion mechanism 17 is instructed to adjust the position of the irradiation-side annular aperture 14 so that the center of the image 28 of the slit of the irradiation-side annular aperture 14 matches the central axis of the focusing lens 4 as illustrated in FIG. 5C.

When the adjustment of the position of the irradiation-side annular aperture 14 is completed, the focusing lens 4 is adjusted. When the focusing lens 4 has astigmatism, and the slit of the irradiation-side annular aperture 14 is actually a true circle, the slit image 28 that exists on the detected electron image 26 is not a true circle. In this case, the astigmatism of the focusing lens 4 is corrected by an astigmatism adjusting mechanism (not illustrated) so that the slit image 28 becomes a true circle, while the detected electron image 26 is viewed.

Figure 6A:
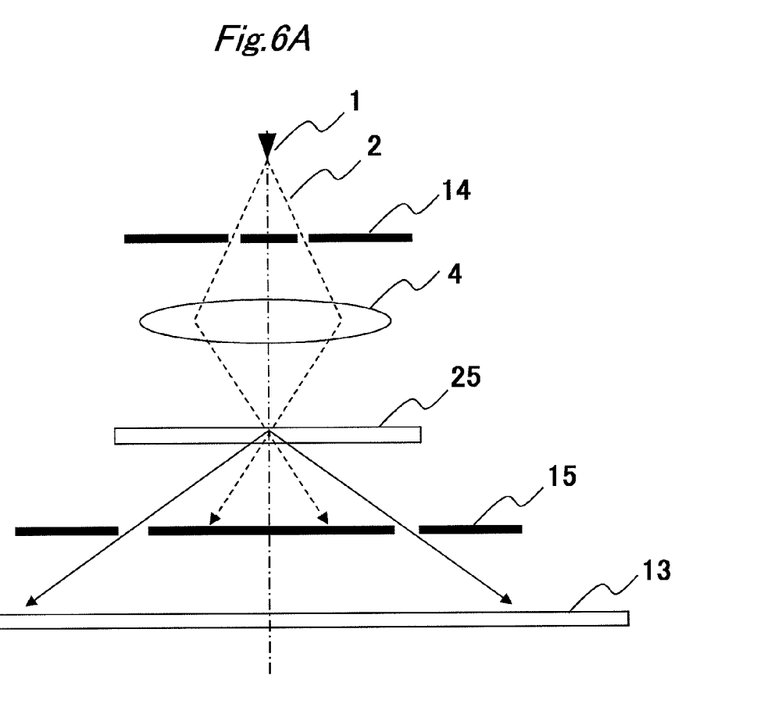
FIG. 6A is a schematic diagram illustrating a state when the position of a first detection-side annular aperture included in the transmission electron microscope according to the first embodiment of the present invention is adjusted.
Figure 6B:
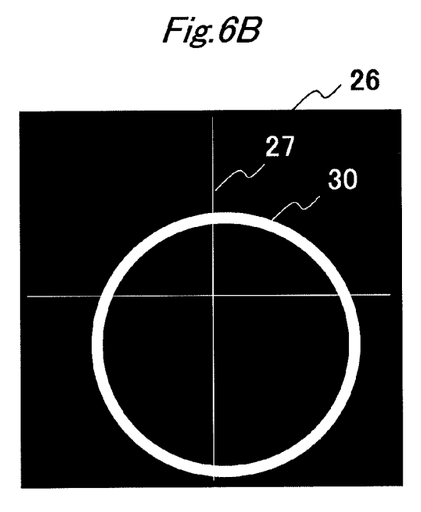
FIG. 6B is a diagram illustrating an adjustment of the position of the first detection-side annular aperture included in the transmission electron microscope according to the first embodiment of the present invention.
Figure 6C:
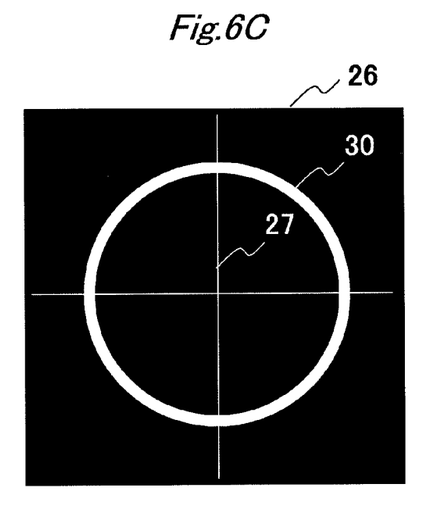
FIG. 6C is another diagram illustrating the adjustment of the position of the first detection-side annular aperture included in the transmission electron microscope according to the first embodiment of the present invention.

Next, the adjustment of the position of the first detection-side annular aperture 15 is described with reference to FIG. 6.

In order to adjust the position of the first detection-side annular aperture 15, the sample stage (not illustrated) is driven so that the focal point of the focusing lens 4 is located on the scattered wave generating portion 25 of the standard sample 50. Then, the scattered wave generating portion 25 is irradiated with the electron beam 2 so that a large amount of scattered waves are generated. Thus, the detected electron image 26 is wholly light. In this state, the micromotion mechanism 18 is driven so that the first detection-side annular aperture 15 is inserted between the standard sample 50 and the electron detector 13 (refer to FIG. 6A). In this case, a ring-shaped part that is included in the detected electron image 26 (refer to FIGS. 6B and 6C) is an image 30 of the slit of the first detection-side annular aperture 15. In these procedures, when the slit image 30 is shifted from the central axis of the focusing lens 4 as illustrated in FIG. 6B, the micromotion mechanism 17 is instructed to adjust the position of the first detection-side annular aperture 15 so that the center of the slit image 30 matches the central axis of the focusing lens 4 as illustrated in FIG. 6C.

Figure 7:
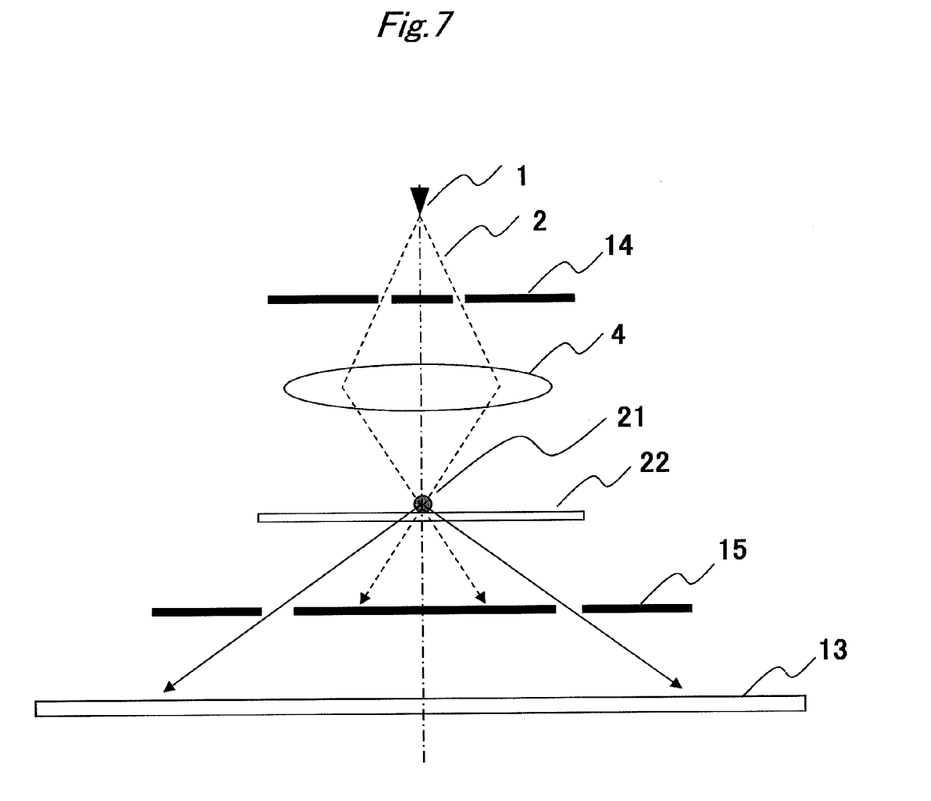
FIG. 7 is a diagram illustrating an adjustment of the position of the standard sample in the transmission electron microscope according to the first embodiment of the present invention.

After that, the sample stage (not illustrated) is driven so that the target 21 of the standard sample 50 matches the crossover or the focal point of the focusing lens 4. In this procedure, the standard sample 50 is scanned on the sample stage and an electron beam that is scattered from the standard sample 50 at a high scattering angle passes through the slit of the detection-side annular aperture 15 and is detected by the electron detector 13. In this manner, a scanning transmission electron microscope image is acquired. The target 21 is matched with the focal point while the electron microscope image is viewed. First, during the adjustment of the vertical position of the sample, when the vertical position of the target 21 matches the focal point, the sharpest two-dimensional image can be acquired. Thus, the sample 50 is moved and the vertical position of the target 21 is adjusted so that the two-dimensional image is sharpest. The target 21 is made up of the atom that is heavier than each of the atoms that form the holding portion 22. Next, the position of the sample in the horizontal direction is adjusted. When the target 21 matches the focal point during the adjustment of the position of the sample in the horizontal direction, the intensity of a detected signal of a scattered electron is highest. Thus, while the scattered electron signal that is detected by the electron detector 13 is monitored, the standard sample 50 is moved to a position so that the intensity of the detected signal is highest. Thus, the target 21 matches the focal point.

Lastly, the adjustment of the position of the second detection-side annular aperture 16 is described with reference to FIG. 8.

Figure 8:
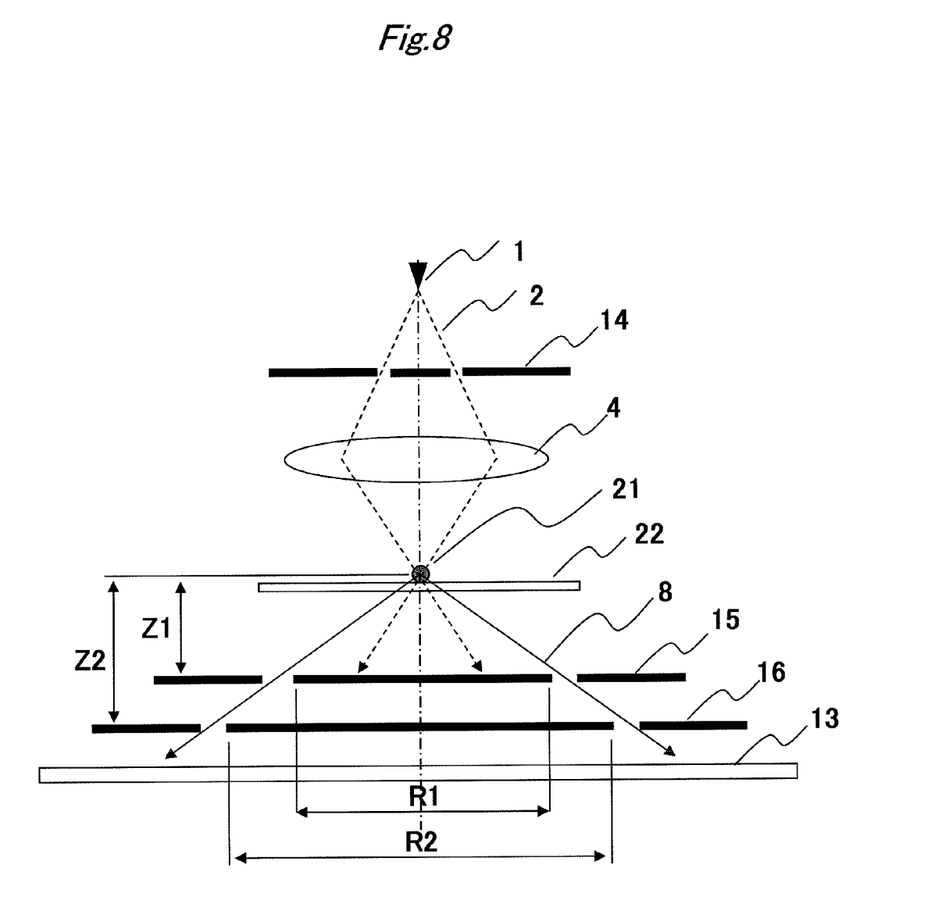
FIG. 8 is a diagram illustrating an adjustment of the position of a second detection-side annular aperture included in the transmission electron microscope according to the first embodiment of the present invention.

In order to adjust the position of the second detection-side annular aperture 16, the micromotion mechanism 19 is driven so that the second detection-side annular aperture 16 is inserted between the first detection-side annular aperture 15 and the electron detector 13 as illustrated in FIG. 8. The second detection-side annular aperture 16 is placed on the axis so that an electron (noise) that is scattered from a region other than the target region 6 and passes through the first detection-side annular aperture 15 is blocked and the electron detector 13 detects only target scattered electrons 8 that have passed through the first detection-side annular aperture 15. In this case, when the slit of the second detection-side annular aperture 16 is shifted from a path of the target scattered electrons 8, the efficiency of detecting the target scattered electrons 8 is low. It is, therefore, necessary that the micromotion mechanism 19 slightly move the second detection-side annular aperture 16 in three dimensional directions. From the perspective of the fact that the path of the target scattered electrons 8 is linear, an approximate position of the second detection-side annular aperture 16 can be geometrically calculated on the basis of distances Z1 and Z2 between the target 21 and the detection-side annular apertures 15 and 16 and inner diameters R1 and R2 of the slits of the detection-side annular apertures 15 and 16. Thus, the second detection-side annular aperture 16 is moved to the geometrically calculated position. Then, the second detection-side annular aperture 16 is slightly moved from the geometrically calculated position so that the intensity of a detected scattered electron is highest, while the intensity of the detected scattered electron is monitored.

The adjustments are completely performed for the observation through the aforementioned procedures. Information of the setting of the current to be applied to the focusing lens 4 and the settings of the positions of the annular apertures 14 to 16 is stored in a storage unit of the control device 20 or an external memory. In order to perform the next adjustments, fine adjustments are performed on the basis of the stored setting information. Thus, operations of preparing an observation can be efficiently performed.

Figure 9:
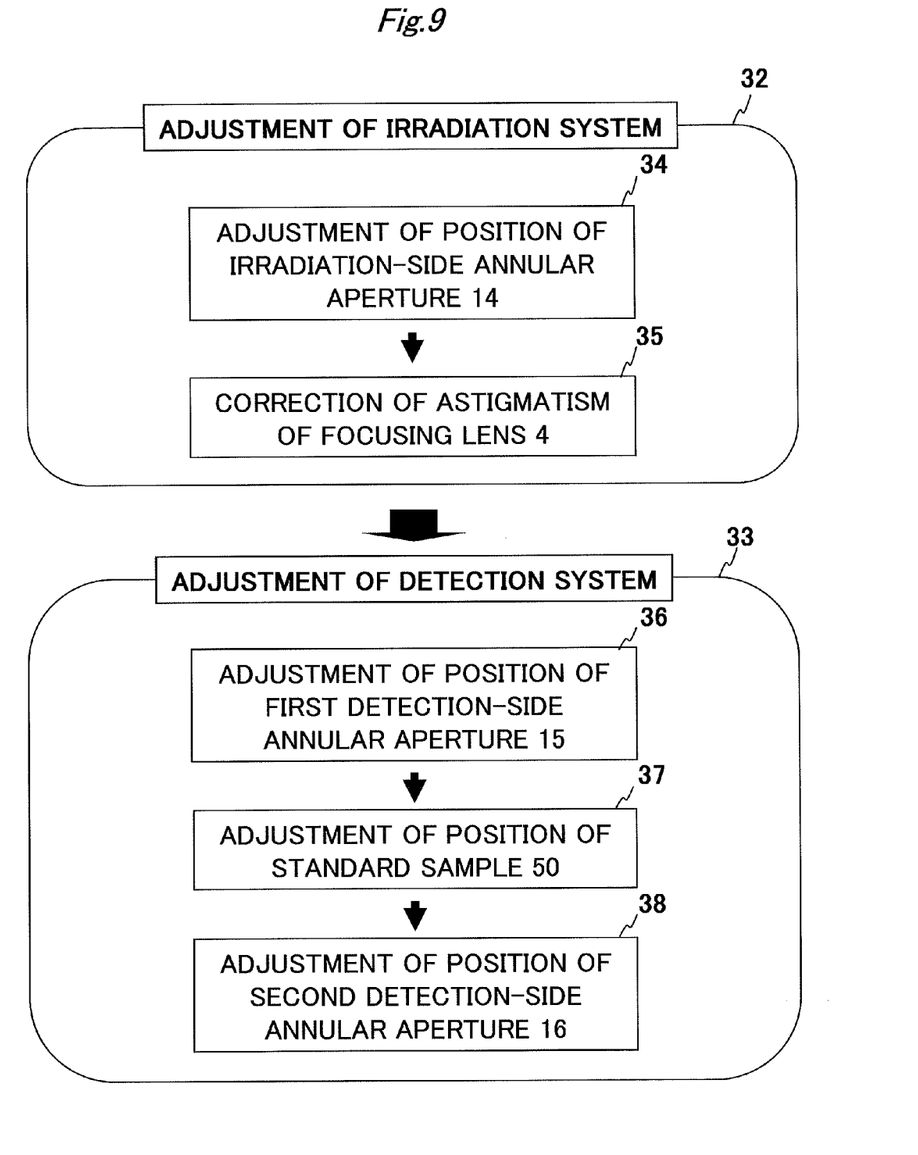
FIG. 9 is a flowchart of whole procedures of adjusting the transmission electron microscope according to the first embodiment of the present invention.

FIG. 9 is a flowchart of procedures for adjusting the device.

As illustrated in FIG. 9, the procedures are mainly divided into an adjustment 32 of the irradiation system for irradiating the single point (target 21) with the electron beam 2 formed in a hollow cone shape and an adjustment 33 of the detection system for detecting only the target electrons 8 scattered from the single point (target 21). The adjustment 32 of the irradiation system includes a positioning 34 (refer to FIG. 5) of the irradiation-side annular aperture 14 and an astigmatism correction 35 of the focusing lens 4. The adjustment 33 of the detection system includes a positioning 36 (refer to FIG. 6) of the first detection-side annular aperture 15, a positioning 37 (refer to FIG. 7) of the standard sample 50 and a positioning 38 (refer to FIG. 8) of the second detection-side annular aperture 16.

The procedures for controlling the device can be manually performed. It is considered that the procedures for controlling the device are automatically performed by the control device 20. Control procedures of the control device 20 when the device is automatically controlled are described below.

<Positioning 34 of Irradiation-Side Annular Aperture 14>

In the procedures, the control device 20 controls the micromotion mechanism 17 in accordance with stored information (or separately set positional information) of a previously set position of the irradiation-side annular aperture 14 so as to insert the irradiation-side annular aperture 14 between the electron gun 1 and the focusing lens 4, causes the micromotion mechanism 17 to move up and down the irradiation-side annular aperture 14, and determines a vertical position of the irradiation-side annular aperture 14 so that the slit image 28 is sharpest. In this case, the vertical position that causes the contrast of the slit image 28 to be highest is selected, for example. Next, the control device 20 drives the micromotion mechanism 17 and causes the micromotion mechanism 17 to move the irradiation-side annular aperture 14 in the horizontal direction on the basis of the acquired detected electron image 26 so that the center of the slit image 28 matches the original point of the guide lines 27.

<Astigmatism Correction 35 of Focusing Lens 4>

In the procedure of correcting the astigmatism, the control device 20 instructs the astigmatism adjusting mechanism (not illustrated) to correct the astigmatism of the focusing lens 4 so that the slit image 28 that exists on the detected electron image 26 becomes a true circle.

<Positioning 36 of First Detection-Side Annular Aperture 15>

In order to adjust the position of the first detection-side annular aperture 15, the control device 20 drives the sample stage (not illustrated) in accordance with stored information (or separately set positional information) of a previously set position of the standard sample 50 so as to position the focal point of the focusing lens 4 on the scattered wave generating portion 25 of the standard sample 50, and causes the scattered wave generating portion 25 to be irradiated with the electron beam 2 so that a large amount of scattered waves are generated. In addition, the control device 20 drives the micromotion mechanism 18 and causes the micromotion mechanism 18 to insert the first detection-side annular aperture 15 between the standard sample 50 and the electron detector 13 in accordance with stored information (or separately set positional information) of a previously set position of the first detection-side annular aperture 15. After that, the control device 20 adjusts a vertical position of the first detection-side annular aperture 15 on the basis of the detected electron image 26 so that the slit image 30 is sharpest. Then, the control device 20 drives the micromotion mechanism 18 and causes the micromotion mechanism 18 to move the first detection-side annular aperture 15 in the horizontal direction so that the center of the slit image 28 matches the original point of the guide lines 27.

<Positioning 37 of Standard Sample 50>

In order to adjust the position of the standard sample 50, the control device 20 causes, on the basis of a two-dimensional or three-dimensional scanning transmission electron microscope image obtained by scanning the sample stage, the standard sample 50 to move to a position from which a signal of a scattered electron with the highest intensity is detected so that the standard sample 50 is located at a vertical position that causes the contrast of the slit image included in the microscope image to be highest.

<Positioning 38 of Second Detection-Side Annular Aperture 16>

In order to adjust the position of the second detection-side annular aperture 16, the control device 20 drives the micromotion mechanism 19 and causes the micromotion mechanism 19 to insert the second detection-side annular aperture 16 between the first detection-side annular aperture 15 and the electron detector 13 in accordance with stored information (or information of a position geometrically calculated on the basis of information of the position of the first detection-side annular aperture 15 and information of the position of the standard sample 50) of a previously set position of the second detection-side annular aperture 16. Then, the control device 20 causes the micromotion mechanism 19 to slightly move the second detection-side annular aperture 16 from the position between the first detection-side annular aperture 15 and the electron detector 13 to a position from which a scattered electron with the highest intensity is detected.

When the aforementioned procedures are programmed and stored in the storage unit of the control device 20, the control device 20 can automatically control the device.

Next, operations and effects of the transmission electron microscope that has the aforementioned configuration are described.

For example, referring to FIG. 3, the electron beam 2 that is emitted by the electron gun 1 passes through the irradiation-side annular aperture 14 and is formed in a hollow shape and focused by the focusing lens 4. Then, the electron beam 2 is incident on the sample 5 at the large irradiation angle α so that the sample 5 is irradiated with the electron beam 2, while the electron beam 2 is formed in a hollow cone shape. Then, the target electrons 8 are scattered from the sample 5 at the large scattering angle β, pass through the detection-side annular apertures 15 and 16 and are detected by the electron detector 13. In this case, the target region 6 of the sample 5 is two-dimensionally or three-dimensionally scanned with the electron beam 2 by an operation of the sample stage. The scanning and the operation of detecting the target scattered electrons 8 are performed in conjunction with each other so that a transmission electron microscope image of the target region 6 is created.

According to the present embodiment, since the two detection-side annular apertures 15 and 16 are arranged in the detection system, an electron (noise) that is scattered from a region other than the target region 6 of the sample 5 can be blocked by any of the detection-side annular apertures 15 and 16, and only the target scattered electrons 8 can reach the electron detector 13. In the present embodiment, only the detection-side annular apertures 15 and 16 are arranged between the sample 5 and the electron detector 13. Thus, an electron lens for the detection system can be omitted by simply arranging the two detection-side annular apertures 15 and 16. A spherical aberration corrector for correcting a spherical aberration of the electron lens is not necessary. In addition, an electron that is scattered at any scattering angle can be detected by arbitrarily designing the inner diameters R1 and R2 of the detection-side annular apertures 15 and 16, the distances Z1 and Z2 between the sample 5 and the detection-side annular apertures 15 and 16, and the area of the electron detector 13. Thus, an electron that is scattered at a high scattering angle of, for example, 80 mrad or higher can be easily detected, and a high depth resolution can be ensured.

According to the present embodiment, it is possible to detect electrons scattered at high angles and improve the depth resolution without a limitation caused by the spherical aberration of the electron lens.

In the present embodiment, the irradiation-side annular aperture 14 is arranged in the irradiation system and the sample is irradiated with the electron beam 2 formed in the hollow cone shape. Thus, an unnecessary electron beam that is located at a central part of the electron beam 2 can be blocked. The focused electron beam that contributes to the depth resolution is incident on the sample 5 at the high irradiation angle so that the sample 5 can be irradiated only with the focused electron beam. Since the unnecessary electron beam is blocked, and the focused electron beam is incident on the sample at the high irradiation angle so that the sample can be efficiently irradiated with the focused electron beam, the focal depth can be small and the depth resolution can be improved. In this manner, the single point can be irradiated only with an electron at a specific high irradiation angle. While the detection system efficiently detects only the target scattered electrons 8, the depth resolution can be improved.

The electron lens is arranged as the focusing lens 4 in the irradiation system. Thus, the focal depth is large due to an influence of the spherical aberration, or a focal point of an electron beam that passes through a central portion of the lens is shifted from a focal point of an electron beam that passes through an outer circumferential portion of the lens. This causes a reduction in the depth resolution. In the present embodiment, however, the influence of the spherical aberration of the focusing lens 4 can be suppressed by blocking the unnecessary electron beam located at the central part of the electron beam 2 and focusing only the electron beam that has passed through the outer circumferential portion of the lens. This contributes to the increase in the depth resolution. In addition, damage of the sample 5 due to the electron beam can be reduced by blocking the unnecessary electron beam located at the central part of the electron beam 2.

In a general tomography observation in which a three-dimensional electron microscope is used to observe a thin film sample, the sample is largely inclined. Thus, a visually estimated thickness of the sample is large and it is difficult for an electron beam to pass through the sample. It is, therefore, difficult to accurately, three-dimensionally observe the sample. Thus, in order for an electron beam to be incident on the sample at an irradiation angle that is as large as possible, to irradiate the sample with the electron beam, and to cause the electron beam pass through the sample, the sample is formed in a needle shape, has a diameter of approximately 200 nm, and is observed while being rotated. In this case, however, a region that can be three-dimensionally observed is physically limited to a range of approximately 200 nm. On the other hand, the thin film sample can be applied to the present embodiment. Thus, a wide range can be three-dimensionally observed in the present embodiment, compared with the conventional technique.

The present embodiment describes the case in which the two detection-side annular apertures 15 and 16 are arranged in the detection system. In the present embodiment, however, three or more detection-side annular apertures may be arranged when necessary.

Second Embodiment

Figure 10:
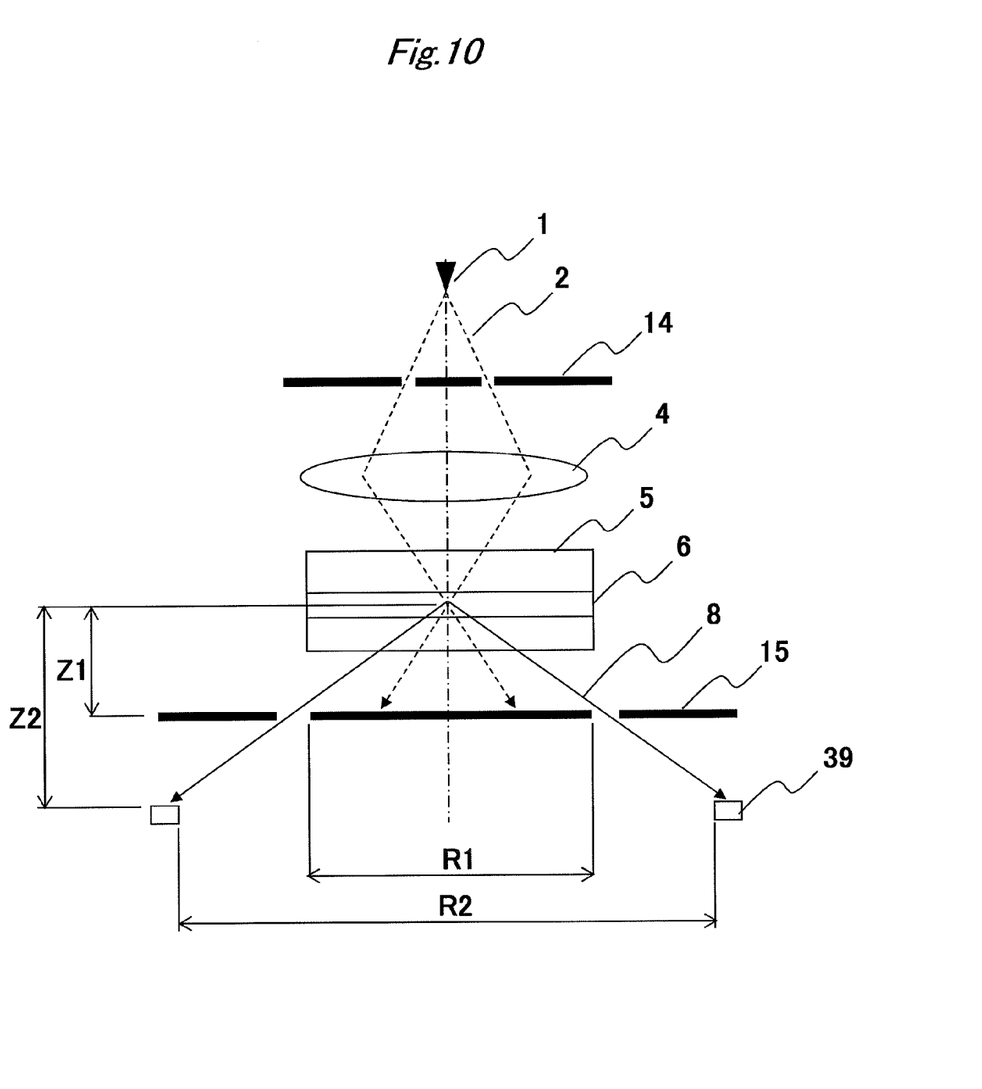
FIG. 10 is a schematic diagram illustrating a transmission electron microscope according to a second embodiment of the present invention.

A second embodiment of the present invention is described with reference to FIG. 10.

The present embodiment is an example in which the second detection-side annular aperture 16 described in the first embodiment is omitted and an electron detector 39 that has an annular light receiving surface corresponding to the slit of the second detection-side annular aperture 16 is used instead of the electron detector 13.

A transmission electron microscope according to the present embodiment includes the electron gun 1, the irradiation-side annular aperture 14, the focusing lens 4, the electron detector 39 and the detection-side annular aperture 15. The electron gun 1 irradiates the sample 5 with the electron beam 2. The irradiation-side annular aperture 14 is located between the electron gun 1 and the sample 5. The focusing lens 4 is located between the irradiation-side annular aperture 14 and the sample 5. The electron detector 39 detects electrons that have passed through the sample 5 and have been scattered. The detection-side annular aperture 15 is located between the electron detector 39 and the sample 5 and has a ring-shaped slit that limits inner and outer diameters of a transmission region of electrons scattered from the sample. In addition, the transmission electron microscope according to the present embodiment also includes the control device 20 and the micromotion mechanisms (micromotion mechanisms 17 to 19 described in the first embodiment) that move the irradiation-side annular aperture 14, the detection-side annular aperture 15 and the electron detector 39 in the optical axis direction (Z direction) of the electron gun 1 and the planar directions (X and Y directions) that are perpendicular to the optical axis direction, although the micromotion mechanisms and the control device 20 are not illustrated in FIG. 10. Other configurations are the same as the first embodiment.

In the present embodiment, only the single detection-side annular aperture 15 is arranged in a detection system. Thus, if the electron detector 13 that has a large light receiving surface were used in the present embodiment, scattered electrons other than the target scattered electrons 8 would be easily detected as noise. In the present embodiment, however, the electron detector 39 that has the annular light receiving surface is used instead of the electron detector 13. Thus, even when a scattered electron other than the target scattered electrons 8 passes through the detection-side annular aperture 15, the light receiving surface does not exist on a path of the interested scattered electron and noise is not detected. Thus, effects that are the same as or similar to the effects described in the first embodiment can be obtained.

DESCRIPTION OF REFERENCE NUMERALS

1 Electron gun
2 Electron beam
4 Focusing lens
5 Sample
8 Target scattered electrons
13 Electron detector
14 Irradiation-side annular aperture
14a Hole portion
14b Shielding plate
15 First detection-side annular aperture
16 Second detection-side annular aperture
17 to 19 Micromotion mechanism
20 Control device
21 Target
22 Holding portion
23 Holding portion
24 Target
25 Scattered wave generating portion
26 Detected electron image
27 Guide lines
28, 30 Slit image
32 Procedure of adjusting irradiation system
33 Procedure of adjusting detection system
34 Procedure of adjusting position of irradiation-side annular aperture
35 Procedure of correcting astigmatism of focusing lens
36 Procedure of adjusting position of first detection-side annular aperture
37 Procedure of adjusting position of standard sample
38 Procedure of adjusting position of second detection-side annular aperture
39 Electron detector
50, 50a to 50c Standard sample
R1, 2 Inner diameter of slit
Z1, 2 Distance
α Irradiation angle
β Scattering angle

The invention claimed is:

1. A transmission electron microscope comprising:
an electron gun that irradiates a sample with an electron beam;
an electron detector that detects electrons that are passed through the sample and scattered;
a first detection-side annular aperture that is located between the electron detector and the sample and has a ring-shaped slit that limits inner and outer diameters of a transmission region of electrons scattered from the sample; and
a second detection-side annular aperture that is located between the first detection-side annular aperture and the electron detector and has a ring-shaped slit that limits inner and outer diameters of a transmission region of scattered electrons that have passed through the first detection-side annular aperture.

2. A transmission electron microscope comprising:
an electron gun that irradiates a sample with an electron beam;
an irradiation-side annular aperture that is located between the electron gun and the sample and has a ring-shaped slit that causes the electron beam emitted by the electron gun to be formed in a hollow cone shape;
a focusing lens that is located between the irradiation-side annular aperture and the sample and focuses, on the sample, the electron beam that has passed through the irradiation-side annular aperture;
an electron detector that detects electrons that are passed through the sample and scattered;
a first detection-side annular aperture that is located between the electron detector and the sample and has a ring-shaped slit that limits inner and outer diameters of a transmission region of electrons scattered from the sample; and a second detection-side annular aperture that is located between the first detection-side annular aperture and the electron detector and has a ring-shaped slit that limits inner and outer diameters of a transmission region of electrons that have passed through the first detection-side annular aperture.

3. The transmission electron microscope according to claim 2, further comprising micromotion mechanisms that move the irradiation-side annular aperture, the first detection-side annular aperture and the second detection-side annular aperture in an optical axis direction of the electron gun and planar directions that are perpendicular to the optical axis direction.

4. The transmission electron microscope according to claim 3, further comprising:

a standard sample that has a target, a holding portion holding the target, and a scattered wave generating portion that has a larger thickness than the holding portion;

a sample stage that moves the sample; and control means for controlling the micromotion mechanisms and the sample stage, wherein the control means performs a procedure of controlling the micromotion mechanism so as to cause the micromotion mechanism to insert the irradiation-side annular aperture between the electron gun and the focusing lens and move, on the basis of a detected electron image, the irradiation-side annular aperture in a horizontal direction at a vertical position that causes the contrast of an image of the slit of the irradiation-side annular aperture to be highest so that the center of the slit image matches an optical axis of the focusing lens, a procedure of driving the sample stage so as to insert the standard sample so that a focal point of the focusing lens is located on the scattered wave generating portion, driving the micromotion mechanism so as to cause the micromotion mechanism to insert the first detection-side annular aperture between the standard sample and the electron detector and move the first detection-side annular aperture in the horizontal direction on the basis of the detected electron image so that the center of an image of the slit of the first detection-side annular aperture matches the optical axis of the focusing lens, a procedure of moving the standard sample on the basis of a scanning transmission electron microscope image obtained by scanning the sample stage so that the target of the standard sample matches the focal point of the focusing lens, and a procedure of driving the micromotion mechanism so as to cause the micromotion mechanism to insert the second detection-side annular aperture between the first detection-side annular aperture and the electron detector and move the second detection-side annular aperture to a position that causes the intensities of scattered electrons of the detected electron image to be highest.

5. A transmission electron microscope comprising:

an electron gun that irradiates a sample with an electron beam;

an irradiation-side annular aperture that is located between the electron gun and the sample and has a ring-shaped slit that causes the electron beam emitted by the electron gun to be formed in a hollow cone shape;

a focusing lens that is located between the irradiation-side annular aperture and the sample and focuses, on the sample, the electron beam that has passed through the irradiation-side annular aperture;

a detection-side annular aperture that and has a ring-shaped slit that limits inner and outer diameters of a transmission region of electrons that have passed through the sample and have been scattered; and an electron detector that detects electrons that have passed through the sample and have been scattered and that has an annular light receiving portion limiting inner and outer diameters of a detection region of electrons passed through the detection-side annular aperture.

6. The transmission electron microscope according to claim 5, further comprising micromotion mechanisms that move the irradiation-side annular aperture, the detection-side annular aperture and the electron detector in an optical axis direction of the electron gun and planar directions that are perpendicular to the optical axis direction.

7. A sample observation method comprising the steps of:

causing a first annular aperture to limit inner and outer diameters of a transmission region of electrons scattered by irradiating a sample with an electron beam;

causing a second annular aperture to further limit inner and outer diameters of a transmission region of electrons passed through the first annular aperture; and causing an electron detector to detect scattered electrons that have passed through the second annular aperture.

8. A sample observation method comprising the steps of:

causing an annular aperture to limit an electron beam and irradiating a sample with the electron beam formed in a hollow cone shape;

causing a first annular aperture to limit inner and outer diameters of a transmission region of electrons scattered from the sample;

causing a second annular aperture to further limit inner and outer diameters of a transmission region of electrons passed through the first annular aperture; and causing an electron detector to detect scattered electrons that have passed through the second annular aperture.

* * * * *